(12) United States Patent
Acosta

(10) Patent No.: US 11,277,670 B2
(45) Date of Patent: *Mar. 15, 2022

(54) HVAC-BASED VOLUME CONTROL

(71) Applicant: RCS Technology, LLC, Poway, CA (US)

(72) Inventor: Matthew Acosta, Escondido, CA (US)

(73) Assignee: RCS Technology, LLC, Poway, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/063,050

(22) Filed: Oct. 5, 2020

(65) Prior Publication Data

US 2021/0058679 A1 Feb. 25, 2021

Related U.S. Application Data

(62) Division of application No. 16/546,639, filed on Aug. 21, 2019, now Pat. No. 10,798,462.

(51) Int. Cl.
*F24F 13/24* (2006.01)
*H04N 21/485* (2011.01)
*G05B 15/02* (2006.01)
*G06F 3/16* (2006.01)

(52) U.S. Cl.
CPC ......... *H04N 21/4852* (2013.01); *F24F 13/24* (2013.01); *G05B 15/02* (2013.01); *G06F 3/165* (2013.01)

(58) Field of Classification Search
CPC ............. H04N 21/485; H04N 21/4318; H04N 21/4396; F24F 13/24; G05B 15/02; G06F 3/16; G06F 3/165; H03G 3/32
USPC .......................................................... 700/94
See application file for complete search history.

(56) References Cited

U.S. PATENT DOCUMENTS

| | | | | |
|---|---|---|---|---|
| 5,621,662 A * | 4/1997 | Humphries | ............ | G05B 15/02 340/3.1 |
| 2004/0260427 A1* | 12/2004 | Wimsatt | ................. | G05B 15/02 700/275 |
| 2006/0029237 A1* | 2/2006 | Aikins | ..................... | H03G 3/32 381/107 |
| 2008/0043996 A1 | 2/2008 | Dolph et al. | | |
| 2008/0112577 A1 | 5/2008 | Crew | | |
| 2009/0281642 A1* | 11/2009 | Ady | ..................... | G11B 33/144 700/94 |
| 2011/0249977 A1 | 10/2011 | Lin | | |
| 2012/0087516 A1* | 4/2012 | Amin | ...................... | H03G 3/32 381/107 |
| 2012/0181010 A1* | 7/2012 | Schultz | ................... | F24F 11/30 165/288 |
| 2016/0111087 A1* | 4/2016 | Srail | ...................... | H03G 3/342 381/107 |
| 2018/0074781 A1* | 3/2018 | Wan | ......................... | H03G 3/02 |
| 2019/0131950 A1* | 5/2019 | Cheung | .................. | H03G 5/165 |

* cited by examiner

*Primary Examiner* — Melur Ramakrishnaiah
(74) *Attorney, Agent, or Firm* — Greenberg Traurig, LLP

(57) ABSTRACT

A system, apparatus and method for automatically controlling the volume of a home entertainment device by an HVAC component. An HVAC component determines when it, or another HVAC, is active or not, and causes a home entertainment device to adjust its volume accordingly.

18 Claims, 5 Drawing Sheets

HVAC-BASED VOLUME CONTROL

CROSS-REFERENCE TO RELATED APPLICATIONS

This application is a divisional of U.S. patent application Ser. No. 16/546,639, filed on Aug. 21, 2019.

BACKGROUND

Field of Use

The present application relates to the field of consumer electronics. More specifically, the present application relates to automatic volume control of home entertainment devices via HVAC equipment.

Description of the Related Art

Consumer-based Heating, Ventilation and Air Conditioning (HVAC) equipment is used to heat and cool homes, comprising central or local air conditioners and heating systems. Such HVAC components are typically controlled by one or more thermostats located in one or more rooms of a residence.

HVAC components, such as compressors, heat pumps, fans, and furnaces, may be quite noisy, on the order of 50-70 decibels when in operation. The sound produced by these components may travel through walls, ceilings and through HVAC ducting to cause unwanted noise that may interfere with sounds produced by TVs or other home entertainment devices. While users may simply adjust the volume of such home entertainment devices in order to compensate for the noise produced by HVAC equipment, the audio interference caused by HVAC components tend to be intermittent, as the HVAC equipment is cycled on and off to regulate temperatures. As such, users may have to adjust the volume of home entertainment devices up when HVAC components are running, and then down again once the HVAC components have finished their heating or cooling cycle.

Thus, it would be desirable to automatically adjust the volume of home entertainment devices to mitigate the audio interference caused by HVAC components.

SUMMARY

The embodiments described herein relate to methods, systems, and apparatus for automatically controlling the volume of a home entertainment device. In one embodiment, an apparatus is described, comprising a memory for storing processor-executable instructions, an emitter for transmitting a volume control signal, the volume control signal for causing the volume of the home entertainment device to increase or decrease, a processor coupled to the memory and the transmitter that executes the processor-executable instructions that causes the apparatus to determine, by the processor, that an HVAC component has been activated, and in response to determining that the HVAC component has been activated, cause, by the processor, the emitter to transmit the volume control signal.

In another embodiment, a method is described, comprising determining, by a processor, that an HVAC component has been activated and in response to determining that the HVAC component has been activated, causing, by the processor, an emitter to transmit a volume control signal, the volume control signal for causing the volume of the home entertainment device to increase when the HVAC component has been activated.

BRIEF DESCRIPTION OF THE DRAWINGS

The features, advantages, and objects of the present invention will become more apparent from the detailed description as set forth below, when taken in conjunction with the drawings in which like referenced characters identify correspondingly throughout, and wherein.

DETAILED DESCRIPTION

The present description relates to systems, methods and apparatus for automatically controlling the volume of consumer-based home entertainment devices, such as televisions, music reproduction equipment (such as audio amplifiers, tuners, receivers, radios, etc.), and even personal electronics, such as tablet computers, wearable devices or earbuds. Such automatic volume control is performed by one or more components of an HVAC system. In one embodiment, a thermostat determines when HVAC equipment is operating or not and, in response, causes a change in the volume of one or more home entertainment devices. In another embodiment, a portable electronic device performs this function.

Figure 1:
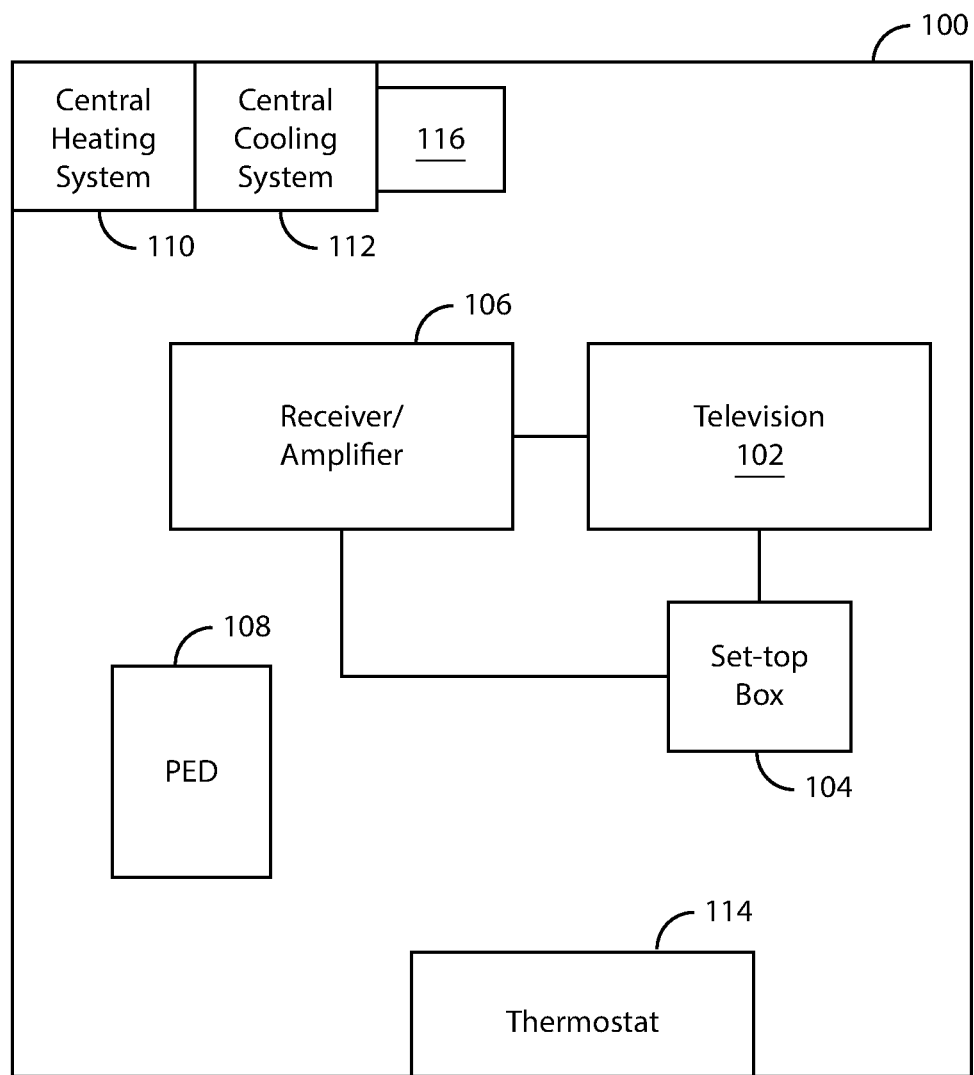
FIG. 1 is a top, plan view of a residence comprising home entertainment equipment and HVAC components utilizing the inventive concepts described herein to automatically control the volume of one or more of the home entertainment devices.

FIG. 1 is a top, plan view of a residence 100 comprising home entertainment components and HVAC components utilizing the inventive concepts described herein to automatically control the volume of one or more of the home entertainment components. In this embodiment, residence 100 comprises a television 102, set-top box 104, receiver/amplifier 106, personal electronic device 108 (collectively, "home entertainment devices"), central furnace 110, central air conditioning unit 112, thermostat 114 and portable electronic device 116. Although residence 100 shows a particular combination of home entertainment devices (i.e., a single television, a single set-top box, a single receiver/amplifier 106 and a single personal electronic device) and a particular HVAC arrangement (i.e., a single furnace, a single air conditioning unit, and a single thermostat), it should be understood that the concepts described herein could be applied to a residence having any number or combination of home entertainment devices and that the HVAC components could comprise any number or combination of components other than what is shown in FIG. 1.

In one embodiment, thermostat 114 is configured to determine when an HVAC component has been activated and/or deactivated, and then thermostat 114 sends a volume control signal to one or more of the home entertainment devices to adjust a respective output volume either up, or louder, when an HVAC component has been activated, or down, or softer, when an HVAC component has been deactivated. In one embodiment, thermostat 114 determines when an HVAC component has been activated or deactivated by determining when thermostat 114 sends a control signal to an HVAC component, i.e., a signal to turn a central air conditioning unit or a central furnace on or off. In one embodiment, thermostat 114 may be programmed by a user to control the amount of volume adjustment of one or more home entertainment devices when an HVAC is activated or deactivated. In one embodiment, thermostat 114 comprises an infra-red emitter in view of an infra-red receiver of one or more home entertainment devices, and thermostat 114 sends volume control signals to the one or more home entertainment devices via the infra-red emitter. In other embodiments, the volume control signal is sent to one or more home entertainment devices via an RF transmitter, such as a Wi-Fi compatible transmitter or other RF-based transmitter compatible with an RF receiver on at least one of the home entertainment devices.

In another embodiment, a portable control unit 116 may be placed, or attached, to one of the HVAC components directly, for example, placed on a central air conditioner unit or central furnace, or on a window-mounted air conditioner. The portable control unit 116 may be battery powered, or it may be powered by household AC power. The portable control unit determines when an HVAC component has been activated or deactivated, and then sends a volume control signal to one or more of the home entertainment devices. In one embodiment, portable control unit 116 may determine activation by sensing a sound, vibration, or an electrical control signal (i.e., on a pair of wires from thermostat 114) generated by the HVAC component when the HVAC is activated, and the lack of sound, vibration or a change in the electrical control signal when the HVAC is deactivated. The portable control unit 116 may comprise an emitter to transmit volume control signals, such as an infra-red LED or an RF transmitter, compatible with an infra-red or RF receiver on at least one of the home entertainment devices.

Figure 2:
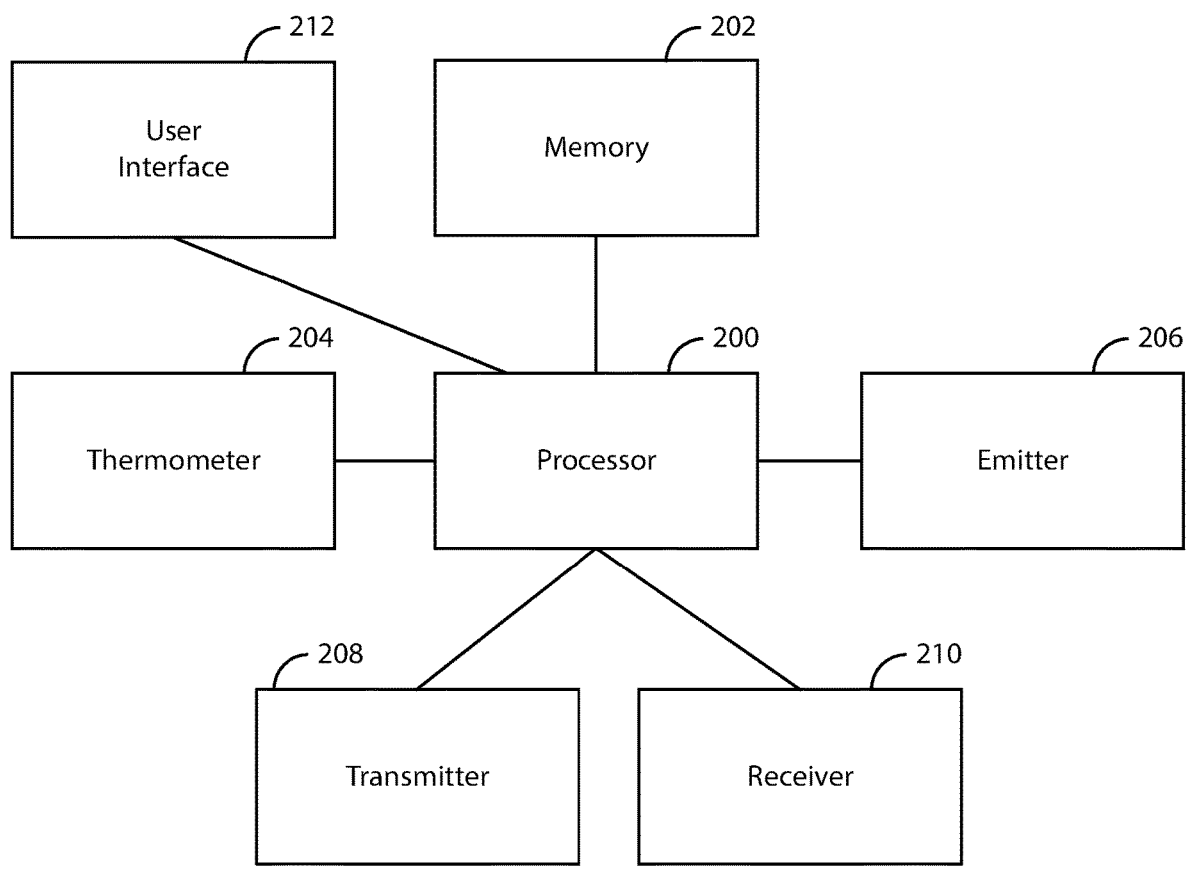
FIG. 2 is a functional block diagram of one embodiment of a thermostat as shown in FIG. 1 in accordance with an embodiment where the thermostat determines when an HVAC component has been activated or deactivated, and automatically controls the volume of one or more home entertainment devices when the HVAC component has been activated or deactivated.

FIG. 2 is a functional block diagram of one embodiment of thermostat 114 in accordance with an embodiment where thermostat 114 determines when an HVAC component has been activated or deactivated, and automatically controls the volume of one or more home entertainment devices. FIG. 2 shows processor 200, memory 202, thermometer 204, emitter 206, transmitter 208, receiver 210, and user interface 212. It should be understood that not all of the functional blocks shown in FIG. 2 are required for operation of thermostat 114, that the functional blocks may be connected to one another in a variety of ways, and that not all functional blocks are necessary for operation of the sensor are shown (such as a power supply), for purposes of clarity.

Processor 200 is configured to provide general operation of the sensor by executing processor-executable instructions stored in memory 202, for example, executable code. Processor 200 typically comprises a general purpose processor, such as an ADuC7024 analog microcontroller manufactured by Analog Devices, Inc. of Norwood Mass., although any one of a variety of microprocessors, microcomputers, and/or microcontrollers may be used alternatively.

Memory 202 comprises one or more information storage devices, such as RAM, ROM, EEPROM, UVPROM, flash memory, SD memory, XD memory, or other type of electronic, optical, or mechanical memory device. Memory 202 is used to store processor-executable instructions for operation of thermostat 114 as well as any information used by processor 200, such as temperature and time setpoints, identification information of thermostat 114 (i.e., a serial number), current or previous temperature and/or humidity levels, one or more volume settings, etc. The instructions cause thermostat 114 to determine when HVAC equipment is running or not, and cause one or more home entertainment devices to adjust a respective volume in order to overcome audio interference caused by the HVAC equipment.

Thermostat 204 is coupled to processor 400 and provides electronic signals representative of an ambient temperature of an area inside residence 100 and proximate to thermostat 114. Thermostat 204 may comprise a mechanical-based or solid-state device that is well-known in the art.

Emitter 206 is coupled to processor 200 and is used to emit volume control signals in some embodiments, generated by processor 200 when processor 200 detects that an HVAC component has become energized or de-energized. In one embodiment, emitter 206 comprises an infra-red light-emitting diode (LED) operating at 940 nanometers. In other embodiments, emitter 206 comprises an RF transmitter configured to operate at a frequency compatible with an RF receiver in one or more home entertainment devices.

Transmitter 208 is coupled to processor 200 and is configured for transmitting HVAC signals to one or more HVAC components. Transmitter 208 comprises circuitry for wireless or wired transmission, such as a wireless RF transmitter compatible with an RF receiver in one or more HVAC components or simply a switch or relay for opening and closing a circuit that is formed between transmitter 208 and one or more HVAC components via common thermostat wiring. In one embodiment, transmitter 208 is used to transmit volume control signals to one or more home entertainment devices in an embodiment in which volume control of home entertainment devices may be controlled by RF signals.

Receiver 210 is coupled to processor 200 and is configured for receiving volume settings from a user, typically over a home Wi-Fi network or some other wireless network, such as a cellular data network. Volume settings may be provided by a user operating a software program, or app, being executed by personal electronic device 108, in the form of an absolute setting (i.e., set volume to "8" or "50 decibels") or a relative setting (i.e., set increase volume by 3 "increments", decrease volume to 3 increments, where "increments" are predetermined volume changes typically used to control TV and other amplification devices using a remote control. Such receivers are well-known in the art.

User interface 212 is coupled to processor 200 and configured for receiving user input, such as temperature/time settings and, in one embodiment, volume settings. A user may provide one or more volume settings to thermostat 114 by entering such volume settings via one or more pushbuttons, knobs, a touchscreen device, etc.

Figure 3:
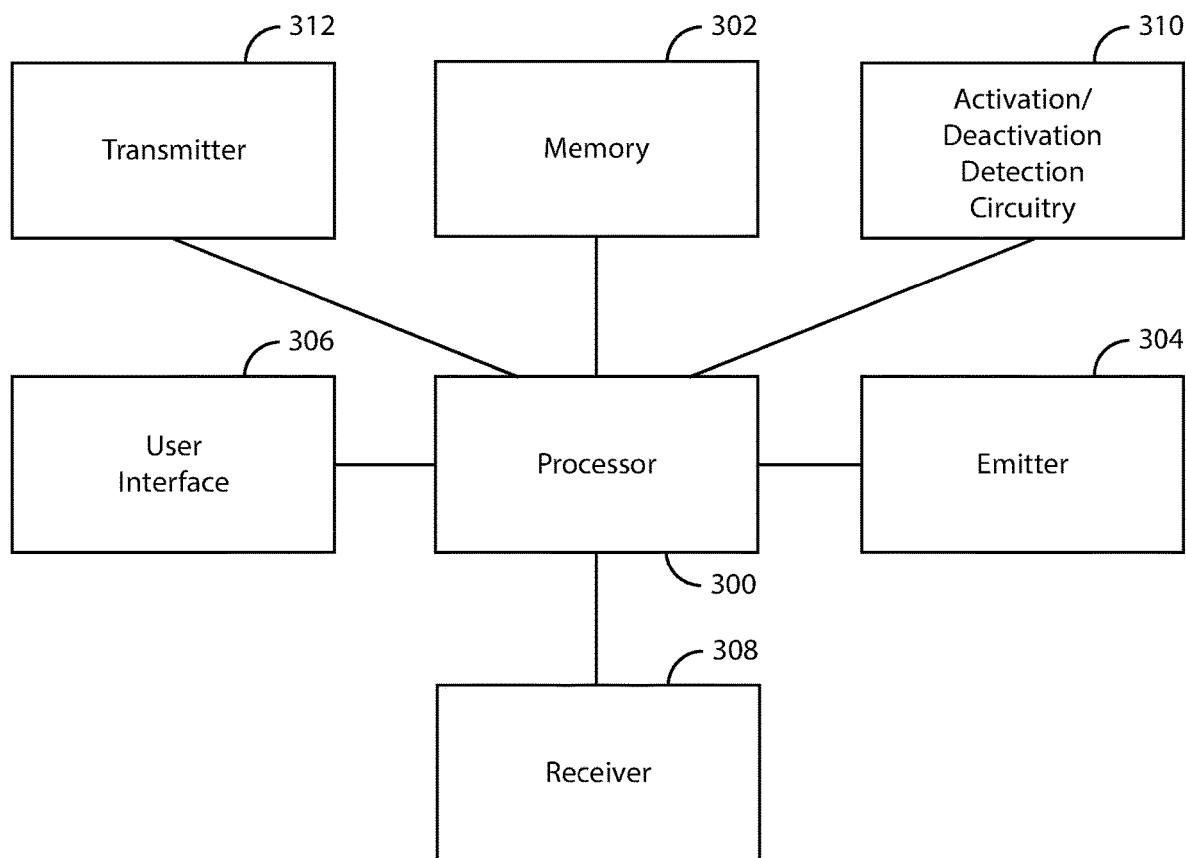
FIG. 3 is a functional block diagram of one embodiment of a portable electronic device as shown in FIG. 1 in accordance with an embodiment where the portable electronic device determines when an HVAC component has been activated or deactivated, and automatically controls the volume of one or more home entertainment devices when the HVAC component has been activated or deactivated.

FIG. 3 is a functional block diagram of one embodiment of portable electronic device 116, in accordance with an embodiment where portable electronic device 116 determines when an HVAC component has been activated or deactivated, and automatically controls the volume of one or more home entertainment devices. Portable device 116 may be used to easily monitor a particular HVAC component, such as a room air conditioner, a fan, a central furnace, a central air conditioning unit, an air conditioning compressor, etc., by placing portable electronic device 116 on or near such HVAC components, requiring little to no integration with such HVAC components. FIG. 3 shows processor 300, memory 302, emitter 304, user interface 306, receiver 308, user interface 310 activation/de-activation detection circuitry 310, and transmitter 312. It should be understood that not all of the functional blocks shown in FIG. 3 are required for operation of portable electronic device 116, that the functional blocks may be connected to one another in a variety of ways, and that not all functional blocks are necessary for operation of the sensor are shown (such as a power supply), for purposes of clarity.

Processor 300 is configured to provide general operation of the sensor by executing processor-executable instructions stored in memory 202, for example, executable code. Processor 300 typically comprises a general purpose processor, such as an ADuC7024 analog microcontroller manufactured by Analog Devices, Inc. of Norwood Mass., although any one of a variety of microprocessors, microcomputers, and/or microcontrollers may be used alternatively. In some embodiments, processor 200, as well as other components of portable electronic device 116, are selected based on power-consumption in embodiments where portable electronic device 116 is battery powered.

Memory 302 comprises one or more information storage devices, such as RAM, ROM, EEPROM, UVPROM, flash memory, SD memory, XD memory, or other type of electronic, optical, or mechanical memory device. Memory 302 is used to store processor-executable instructions for operation of portable electronic device 116 as well as any information used by processor 300, such as one or more volume settings. The instructions cause portable electronic device 116 to determine when a particular HVAC component is running or not, and cause one or more home entertainment devices to adjust a respective volume in order to overcome audio interference caused by the HVAC component.

Emitter 304 is coupled to processor 300 and is used to emit volume control signals in some embodiments, generated by processor 300 when processor 300 detects that an HVAC component has become energized or de-energized. In one embodiment, emitter 304 comprises an infra-red light-emitting diode (LED) operating at 940 nanometers. In other embodiments, emitter 304 comprises an RF transmitter configured to operate at a frequency compatible with an RF receiver in one or more home entertainment devices.

User interface 306 is coupled to processor 300 and configured for receiving user input, such as volume settings. A user may provide one or more volume settings to portable electronic device 116 by entering such volume settings via one or more pushbuttons, knobs, a touchscreen device, etc.

Receiver 308 is coupled to processor 300 and is configured for receiving volume settings from a user, typically over a home Wi-Fi network or some other wireless network, such as a cellular data network. Such receivers are well-known in the art.

Activation/De-activation detection circuitry 310 is used to determine when an HVAC component has been activated or de-activated, typically by a separate HVAC component, such as thermostat 116. Activation/De-activation detection circuitry 310 comprises a microphone and associated audio amplification circuitry in an embodiment where portable electronic device 116 detects activation and de-activation of an HVAC component by monitoring sounds produced by the HVAC component while it is operating vs. an ambient noise level when the HVAC component is dormant. In another embodiment, Activation/De-activation detection circuitry 310 comprises input and output contacts that are wired in series with thermostat control wires from thermostat 116. The activation/de-activation detection circuitry 310 further includes circuitry that monitors the thermostat control wires and detects when a change has occurred via the control wires, such as thermostat 116 opening or closing a switch or relay that is used to operate a central furnace and/or air conditioning component. In yet another embodiment, activation/de-activation detection circuitry 310 comprises a vibration sensor, such as a mechanical or solid-state device, that detects when a monitored HVAC component has been activated. Typically, HVAC components generate mechanical vibration when they are activated, and the vibration sensor detects operation of an HVAC component by detecting vibration when the HVAC is operating and no or little vibration while the HVAC component is dormant.

Transmitter 312 is used in one embodiment, coupled to processor 300 configured for transmitting volume control signals to one or more home entertainment devices in an embodiment in which volume control of home entertainment devices may be controlled by RF signals.

Figure 4A:
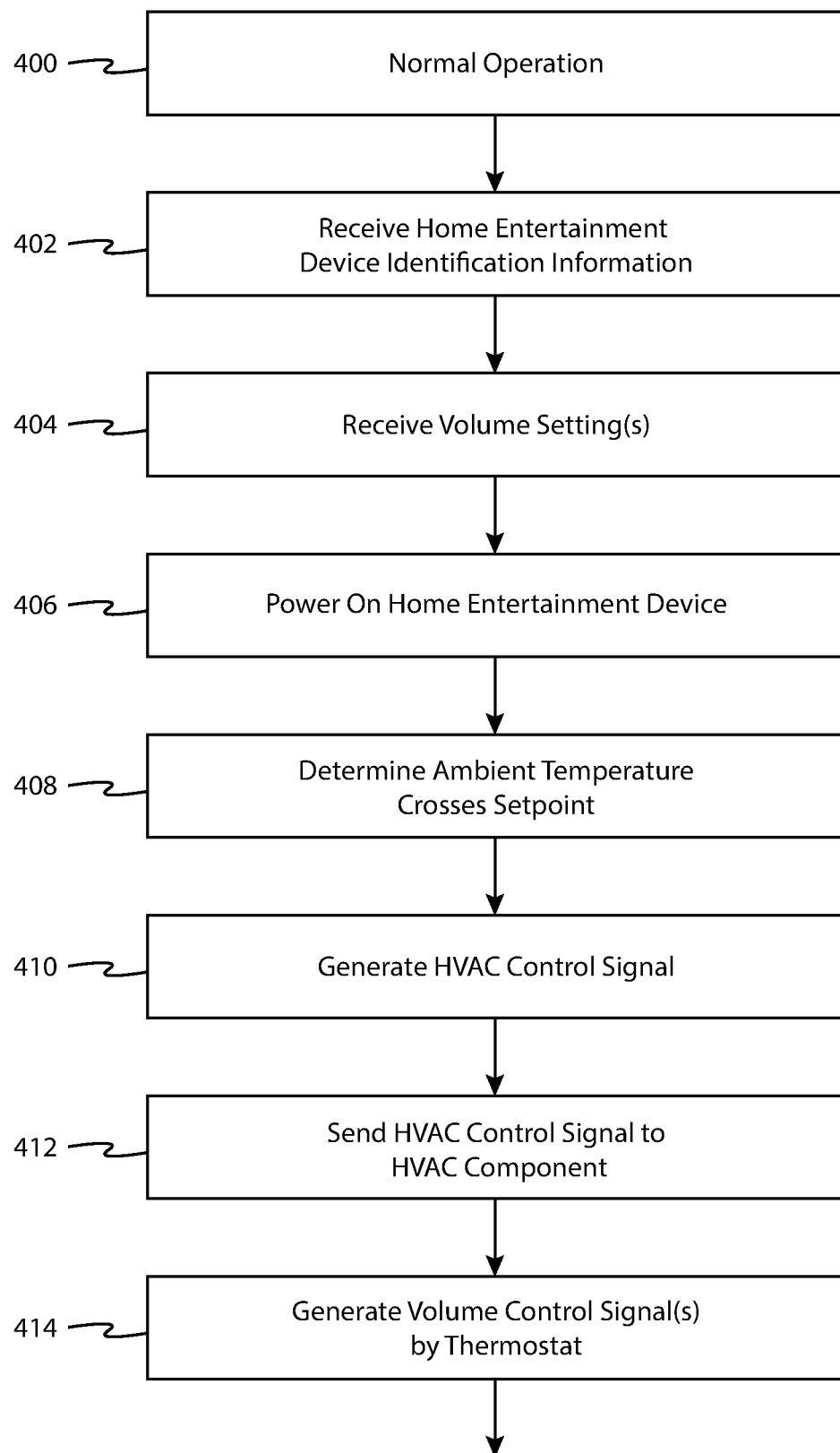
FIGS. 4A and 4B represent a flow diagram illustrating one embodiment of a method, performed by the thermostat of FIGS. 1 and 2, for automatic volume control of a home entertainment device when an HVAC component has been activated or deactivated.
Figure 4B:
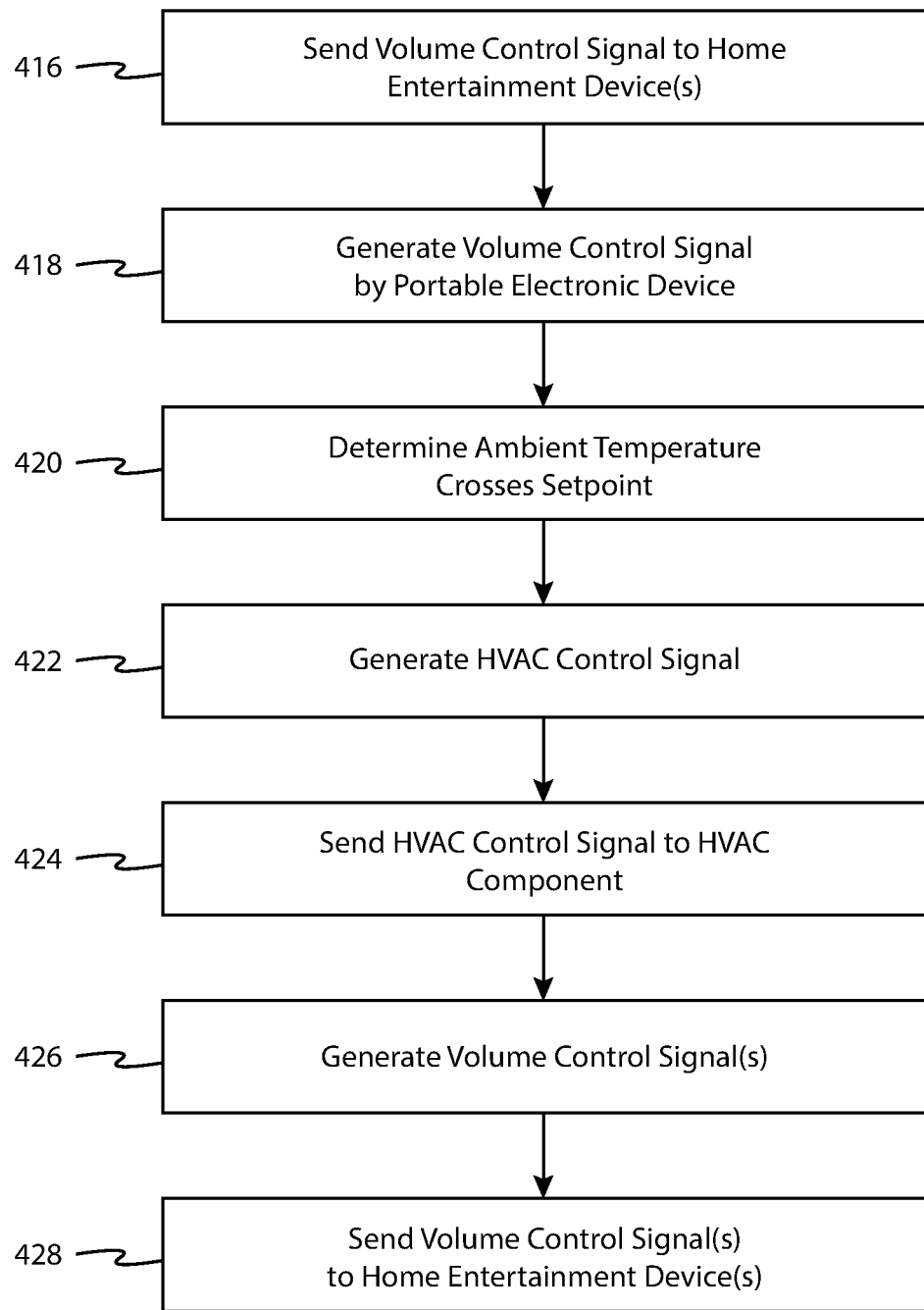

FIG. 4 is a flow diagram illustrating one embodiment of a method, performed by thermostat 114, for automatic volume control of a home entertainment device when an HVAC component has been activated or deactivated, in order to mitigate the effects of unwanted noise produced by the HVAC component. It should be understood that the method described herein with respect to FIG. 4 could alternatively be performed by an HVAC component other than thermostat 114, such as by a central air conditioner, central furnace, window-mounted air conditioner, compressor, etc. It should also be understood that in some embodiments, not all of the method steps shown in FIG. 4 are performed, and that the order in which the steps are performed may be different in other embodiments.

At block 400, thermostat 114 is operating normally within residence 100, having a setpoint stored in memory 202 at which cooling or heating should occur. Processor 200 monitors thermometer 204 to determine when the ambient temperature around thermostat 114 exceeds the setpoint. At this point, the ambient temperature proximate to thermostat 114 is such that neither heating nor cooling of residence 114 by central furnace 110 or central air conditioning unit 112 is needed.

At block 402, processor 200 receives identification information, via receiver 210 or user interface 212, indicating an identity of one or more home entertainment devices. The identification information from receiver 210 may originate from an app executed on personal electronic device 108, such as a smartphone, tablet computer, or other computing/communication device. The identification information may comprise a make, model, manufacturer's code, etc. of a home entertainment device, provided as alpha-numeric information, a bar code, a QR code, or some other representation of identification information of one or more home entertainment devices that a user wishes to control when one or more HVAC components are activated or deactivated. In one embodiment, memory 202 is preloaded with a lookup table comprising a list of home entertainment devices, each cross-referenced to a particular home entertainment device communication protocol.

In another embodiment, processor 200 causes thermostat 114 to "pair" with one or more home entertainment devices using well-known pairing techniques in the art. Such pairing allows communication between a home entertainment device and thermostat 114, typically via transmitter 208 and receiver 210.

At block 404, processor 200 may receive one or more volume settings via receiver 210 or user interface 212, each volume setting indicating a desired volume of a home entertainment device by a user of the home entertainment device when one or more HVAC components are activated or deactivated. The volume setting may comprise an absolute volume or a relative volume. The volume setting may comprise a number of volume increase commands for thermostat 114 to send when one or more HVAC components are activated by thermostat 114. In one embodiment, the volume setting indicated by a user causes processor 200 to generate equal volume adjustment signals for volume increases as well as volume decreases. The volume setting typically causes a home entertainment device to change its volume only slightly to modestly, i.e., on the order of 0.1 decibels to 5 decibels, so that a user can still hear audio signals from the home entertainment device in spite of noise generated by one or more HVAC components when activated. Processor 200 stores the volume setting(s) in memory 202.

At block 406, a home entertainment device, such as a television, receiver, set-top box, iPad, iPod, is turned on by a user. A volume of the home entertainment device is set to a desirable level, either manually by the user or by default by the home entertainment device. The volume is set so that the user can hear audio from the home entertainment device at a comfortable level.

At block 408, processor 200 determines that the ambient temperature in residence 100 proximate to thermostat 114 has met or exceeded the setpoint while thermostat 114 is in a cooling mode, or that the ambient temperature has met or decreased below the setpoint while thermostat 114 is in a heating mode. For example, in a cooling mode, when the ambient temperature has climbed to 76 degrees and the setpoint is 75 degrees. Or, alternatively, in a heating mode, that the ambient temperature has fallen to 71 degrees and the setpoint is 72 degrees.

At block 410, in response to determining that the ambient temperature has met or exceeded the setpoint while thermostat 114 is in a cooling mode, or that the ambient temperature has met or fallen below the setpoint while thermostat 114 is in a heating mode, processor 200 generates an HVAC control signal to activate one or more HVAC components. In the case that the ambient temperature exceeds a cooling setpoint, i.e., that the ambient temperature proximate to thermostat 114 has increased past a desired temperature, the HVAC control signal causes central air conditioning system 112 to activate. Alternatively, when the ambient temperature falls below a heating setpoint, i.e., that the ambient temperature proximate to thermostat 114 has decreased past a desired temperature, the HVAC control signal causes central furnace 110 to activate.

At block 412, processor 200 sends the HVAC control signal to one or more of the HVAC components via transmitter 208 (or via wiring).

At block 414, in response to sending the HVAC control signal, processor 200 generates one or more volume control signals that causes one or more home entertainment devices to increase a volume of the one or more home entertainment devices. The volume control signal is generated in accordance with a communication protocol of one or more of the home entertainment devices, i.e., an IR or RF communication protocol, as specified by the information stored in memory 202. Processor 200 may generate the volume control signal in accordance with the volume setting received in a previous block, i.e. generate a volume control signal that causes one or more home entertainment devices to increase its volume by an amount specified by the volume setting. In one embodiment, the volume control signal comprises two or more signals, each signal causing one or more home entertainment devices to increase its volume by a predetermined amount, where the number of signals generated by processor 200 causes one or more home entertainment devices to increase its/their volume by the amount specified by the volume setting.

At block 416, processor 200 sends the volume control signal to one or more home entertainment devices via emitter 206 and/or transmitter 208, depending on the communication protocol used to generate the volume control signal. The volume control signal is received by one or more of the home entertainment devices, causing the one or more home entertainment devices to increase an output volume in an amount in accordance with the volume setting or, in another embodiment, by a fixed, predetermined amount as prestored in memory 202. The volume increase caused by the volume control signal enables the user to comfortably hear audio from one or more of the entertainment devices over the noise caused by one or more of the activated HVAC components.

At block 418, in an embodiment where portable control unit 116 is used to determine activation and deactivation of an HVAC component, processor 300 determines activation and deactivation using one or more techniques, such as by monitoring electronic signals on wiring from thermostat 114 to detect "on" and "off" signals from thermostat 114, monitoring audio signals received by activation/de-activation detection circuitry 310 to determine activation when audio signals exceed a threshold stored in memory 302 and deactivation when audio signals are below the threshold, monitoring for vibration to determine activation when vibration exceeds a vibration threshold stored in memory and deactivation when the vibration sensed by activation/de-activation detection circuitry 310 falls below the threshold, etc. Upon detection of activation of an HVAC component, processor 300 generates a volume control signal, as described above, and sends the volume control signal to one or more home entertainment devices via emitter 304 and/or transmitter 312.

At block 420, at some later time, processor 200 determines that the ambient temperature in residence 100 proximate to thermostat 114 has met or fallen below the setpoint while thermostat 114 is in a cooling mode, or that the ambient temperature has met or exceeded the setpoint while thermostat 114 is in a heating mode. For example, in a cooling mode, the ambient temperature falling to 74 degrees when the setpoint is 75 degrees when thermostat 114. Or, alternatively, that the ambient temperature has increased to 76 degrees when the setpoint is 75 degrees.

At block 422, in response to determining that the ambient temperature has met or fallen below the setpoint in a cooling mode, or met or exceeded the setpoint in a heating mode, processor 200 generates an HVAC control signal to deactivate one or more HVAC components. In the case that the ambient temperature has fallen below a cooling setpoint, i.e., that the ambient temperature proximate to thermostat 114 has decreased past the cooling setpoint, the HVAC control signal causes central air conditioning system 112 to deactivate, i.e., turn off. Alternatively, when the ambient temperature meets or exceeds a heating setpoint, i.e., that the ambient temperature proximate to thermostat 114 has increased past a heating setpoint, the HVAC signal causes central furnace 110 to deactivate.

At block 424, processor 200 sends the HVAC control signal to one or more of the HVAC components via transmitter 208 (or via wiring).

At block 426, in response to sending the HVAC control signal, processor 200 generates one or more volume control signals that causes the one or more home entertainment devices to decrease a volume of the one or more home entertainment devices. Processor 200 may generate the volume control signal in accordance with the volume setting received in a previous block, i.e. generate a volume control signal that causes one or more home entertainment devices to decrease its volume by an amount specified by the volume setting. In one embodiment, the volume control signal comprises two or more signals, each signal causing one or more home entertainment devices to decrease its volume by a predetermined amount, where the number of signals generated by processor 200 causes one or more home entertainment devices to decrease its/their volume by the amount specified by the volume setting.

At block 428, processor 200 sends the volume control signal to the one or more home entertainment devices via emitter 206 and/or transmitter 208, depending on the communication protocol used to generate the volume control signal. The volume control signal is received by one or more of the home entertainment devices, causing the one or more home entertainment devices to decrease an output volume in an amount in accordance with the volume setting or, in another embodiment, by a fixed, predetermined amount as prestored in memory 202. The volume decrease caused by the volume control signal re-adjusts the volume of one or more home entertainment devices back to a volume that is comfortable for the user when no noise is generated by any HVAC component.

The methods or algorithms described in connection with the embodiments disclosed herein may be embodied directly in hardware or embodied in processor-readable instructions executed by a processor. The processor-readable instructions may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components.

Accordingly, an embodiment of the invention may comprise a computer-readable media embodying code or processor-readable instructions to implement the teachings, methods, processes, algorithms, steps and/or functions disclosed herein.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

I claim:

1. An apparatus for automatically controlling a volume of a home entertainment device, comprising:

a memory for storing processor-executable instructions;

an emitter for transmitting a volume control signal, the volume control signal for causing the volume of the home entertainment device to increase or decrease;

a processor coupled to the memory and the emitter that executes the processor-executable instructions that causes the apparatus to:

determine, by the processor, that the apparatus has been used to activate or deactivate a noise generating device; and in response to determining that the apparatus has been used to activate or deactivate the noise generating device, cause, by the processor, the emitter to transmit the volume control signal.

2. The apparatus of claim 1, wherein the volume control signal comprises one or more instructions to increase or decrease the volume of the home entertainment device a pre-established amount.

3. The apparatus of claim 1, wherein the emitter comprises an infra-red light source compatible with an infra-red receiver of the home entertainment device.

4. The apparatus of claim 1, wherein the emitter comprises an RF transmitter compatible with an RF receiver of the home entertainment device.

5. The apparatus of claim 1, further comprising: a user interface coupled to the processor; and the processor-executable instructions further comprise instructions that causes the apparatus to: receive, by the processor via the user interface, an identification of the home entertainment device; store, by the processor in a memory coupled to the processor, the identification; and select, by the processor, a communication protocol stored in the memory in association with the identification to generate the volume control signal.

6. The apparatus of claim 1, further comprising: an RF receiver coupled to the processor; and the processor-executable instructions further comprise instructions that causes the apparatus to: receive, by the processor via the RF receiver, an identification of the home entertainment device; store, by the processor in a memory coupled to the processor, the identification; and select, by the processor, a communication protocol stored in the memory in association with the identification to generate the volume control signal.

7. The apparatus of claim 1, wherein the apparatus comprises a thermostat and the noise generating device comprises an HVAC component.

8. The apparatus of claim 1, further comprising: a user interface coupled to the processor; and the processor-executable instructions further comprise instructions that causes the apparatus to: receive, by the processor via the user interface, a volume setting, the volume setting indicative of a desired volume of the home entertainment device when the noise generating device is caused to be activated by the apparatus; and wherein the processor-executable instructions that causes the processor to generate the volume control signal comprises instructions that causes the processor to: generate the volume control signal in accordance with the volume setting that causes the home entertainment device to adjust the volume of the home entertainment device to the desired volume.

9. The apparatus of claim 1, further comprising: an RF receiver coupled to the processor; and the processor-executable instructions further comprise instructions that causes the apparatus to: receive, by the processor via the RF receiver, a volume setting, the volume setting indicative of a desired volume of the home entertainment device when the noise generating device is caused to be activated by the apparatus; and wherein the processor-executable instructions that causes the processor to generate the volume control signal comprises instructions that causes the processor to: generate the volume control signal in accordance with the volume setting that causes the home entertainment device to adjust the volume of the home entertainment device to the desired volume.

10. A method for automatically controlling a volume of a home entertainment device, comprising:
determining, by a processor of a controlling device, that the controlling device has been used to activate a noise generating device;
and in response to determining that the controlling device has been used to activate the noise generating device, automatically causing, by the processor of the controlling device, an emitter to transmit a volume control signal, the volume control signal for causing the volume of the home entertainment device to increase when the controlling device has been used to activate the noise generating device.

11. The method of claim 10, wherein the volume control signal comprises one or more instructions to increase or decrease the volume of the home entertainment device an amount consistent with the ambient sound level change.

12. The method of claim 10, wherein the emitter comprises an infra-red light source compatible with an infra-red receiver of the home entertainment device.

13. The method of claim 10, wherein the emitter comprises an RF transmitter compatible with an RF receiver of the home entertainment device.

14. The method of claim 10, further comprising: receiving, by the processor via a user interface coupled to the processor, an identification of the home entertainment device; storing, by the processor, the identification in a memory coupled to the processor; and selecting, by the processor, a communication protocol stored in the memory in association with the identification to generate the volume control signal.

15. The method of claim 10, further comprising: receiving, by the processor via a receiver coupled to the processor, an identification of the home entertainment device; storing, by the processor, the identification in a memory coupled to the processor; and selecting, by the processor, a communication protocol stored in the memory in association with the identification to generate the volume control signal.

16. The method of claim 10, wherein the controlling device comprises a thermostat.

17. The method of claim 10, further comprising: receiving, by the processor via a user interface coupled to the processor, a volume setting, the volume setting indicative of a desired volume of the home entertainment device when the controlling device causes the noise generating device to be activated; and generating the volume control signal in accordance with the volume setting that causes the home entertainment device to adjust the volume of the home entertainment device to the desired volume.

18. The method of claim 10, further comprising: receiving, by the processor via an RF receiver coupled to the processor, a volume setting, the volume setting indicative of a desired volume of the home entertainment device when the controlling device causes the noise generating device to be activated; and generating the volume control signal in accordance with the volume setting that causes the home entertainment device to adjust the volume of the home entertainment device to the desired volume.

* * * * *